United States Patent [19]

Feinberg

[11] Patent Number: 5,612,619
[45] Date of Patent: Mar. 18, 1997

[54] GRASE-TYPE THREE-DIMENSIONAL MR PULSE SEQUENCES

[76] Inventor: David A. Feinberg, 41 Hanzel Rd., Shokan, N.Y. 12481-5319

[21] Appl. No.: 509,071

[22] Filed: Jul. 31, 1995

[51] Int. Cl.⁶ ........................................ G01V 3/00
[52] U.S. Cl. ............................ 324/309; 324/307
[58] Field of Search ........................ 324/300, 307, 324/309, 318, 322; 128/653.1, 653.2, 653.3

[56] References Cited

U.S. PATENT DOCUMENTS 5,270,654  12/1993  Feinberg et al. ................... 324/309
5,402,067  3/1995  Pauly et al. ......................... 324/309
5,459,400  10/1995  Moonen ............................ 324/309

*Primary Examiner*—Louis M. Arana
*Attorney, Agent, or Firm*—Mark H. Jay

[57] ABSTRACT

A three-dimensional GRASE-type MR pulse sequence varies phase-encoding along the Z-axis identically in all signals between each two adjacent RF refocussing pulses in the MR pulse sequence. The phase error modulation caused by magnetic field inhomogeniety and the T2 amplitude modulation are separated onto two different spatial axes. This permits complete elimination of periodicity in both modulations and thereby improves image quality.

5 Claims, 5 Drawing Sheets

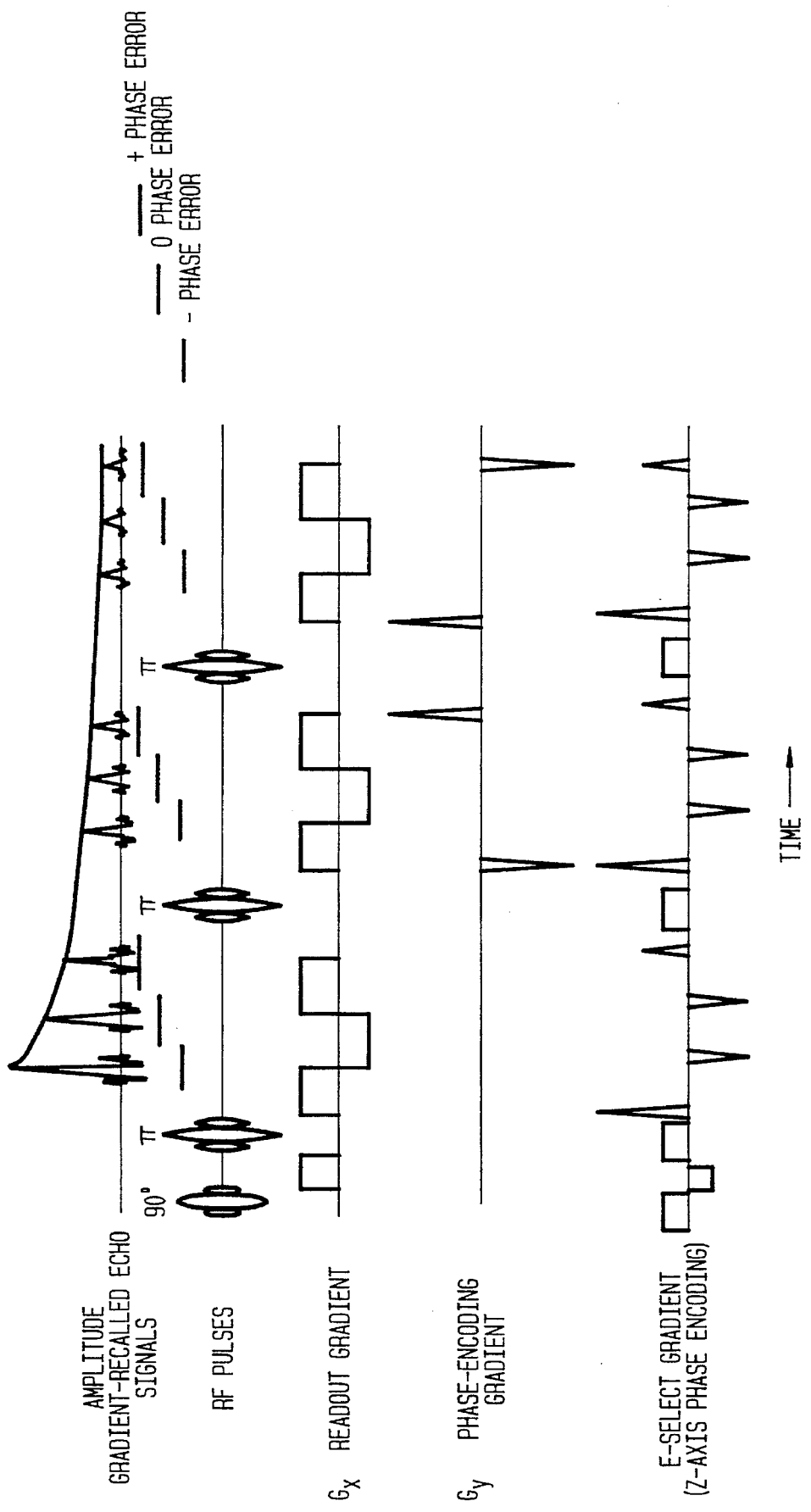

GRASE-TYPE THREE-DIMENSIONAL MR PULSE SEQUENCES

CROSS-REFERENCE TO RELATED APPLICATION

This application is a continuation-in-part of a prior application filed by the herein-named inventor on Jul. 20, 1995. The contents of this prior application, including the drawings, are hereby incorporated herein as if fully set forth.

BACKGROUND OF THE INVENTION

The invention relates to diagnostic imaging, and more particularly relates to magnetic resonance (MR) imaging. In its most immediate sense, the invention relates to MR pulse sequences.

The above-referenced parent patent application, which relates to two-dimensional MR pulse sequences, describes a problem inherent in conventional MR pulse sequences of the GRASE type. This problem is that because of the effect of T2 decay combined with the order in which lines of MR data are acquired, the data in the k-space matrix is highly amplitude-modulated ("AM"). When the k-space data is Fourier-transformed, this amplitude modulation is decoded as multiple edges of diminishing contrast and regular spacing ("ringing artifacts"). These AM ringing artifacts are distracting and interfere with the diagnostic quality of the final MR image.

Conventional three-dimensional MR pulse sequences of the GRASE type also inherently suffer from this problem. This is because a conventional three-dimensional GRASE-type MR pulse sequence is merely a set of two-dimensional GRASE-type pulse sequences, wherein each member of the set acquires all in-plane data at a constant phase-encoding gradient in the Z direction. As a result, conventional three-dimensional MR pulse sequences of the GRASE type inherently suffer from amplitude modulation of the MR data, and inherently produce ghost artifacts, especially when the sequences are long and T2 decay thereby causes a pronounced effect.

One object of the invention is to provide a three-dimensional GRASE-type MR pulse sequence which does not suffer from artifacts caused by amplitude modulation of the acquired MR data as a result of T2 decay.

Another object of the invention is to provide such an MR pulse sequence in which AM artifacts and phase modulation artifacts are completely absent.

Yet a further object of the invention is to improve on MR sequences of this general type.

The invention proceeds from a realization that a three-dimensional MR pulse sequence is subject to less stringent constraints than is a two-dimensional MR pulse sequence. The above-referenced parent patent application discloses a two-dimensional GRASE-type MR pulse sequence in which amplitude modulation of the acquired MR data is traded against phase modulation of the acquired MR data. This tradeoff is necessary because in the there-disclosed MR pulse sequence, phase-encoding takes place exclusively along a single in-plane axis. However, in a three-dimensional MR pulse sequence, phase encoding takes place in two directions, namely along the in-plane axis and the Z-axis. As a result, amplitude modulation need not be traded off against phase modulation. Indeed, it is possible to acquire lines of MR data using a scheme of GRASE-type phase encoding wherein artifacts resulting from amplitude modulation and from phase modulation are completely eliminated.

In accordance with the invention, there is provided a three-dimensional GRASE-type MR pulse sequence wherein, between each two adjacent RF refocussing pulses, the phase-encoding along the Z axis is varied identically. There consequently is no in-plane amplitude modulation of the acquired MR data. So, too, there consequently is no in-plane phase modulation of the acquired MR data. Advantageously, and in accordance with the preferred embodiment, the in-plane phase encoding remains constant between each two adjacent RF refocussing pulses and varies monotonically from the beginning of the MR pulse sequence to the end.

BRIEF DESCRIPTION OF THE DRAWINGS

The invention will be better understood with reference to the following illustrative and non-limiting drawings, in which:

FIG. 5 shows a three-dimensional GRASE-type MR pulse sequence in accordance with a second preferred embodiment of the invention.

DETAILED DESCRIPTION OF PREFERRED EMBODIMENTS

Figure 1:
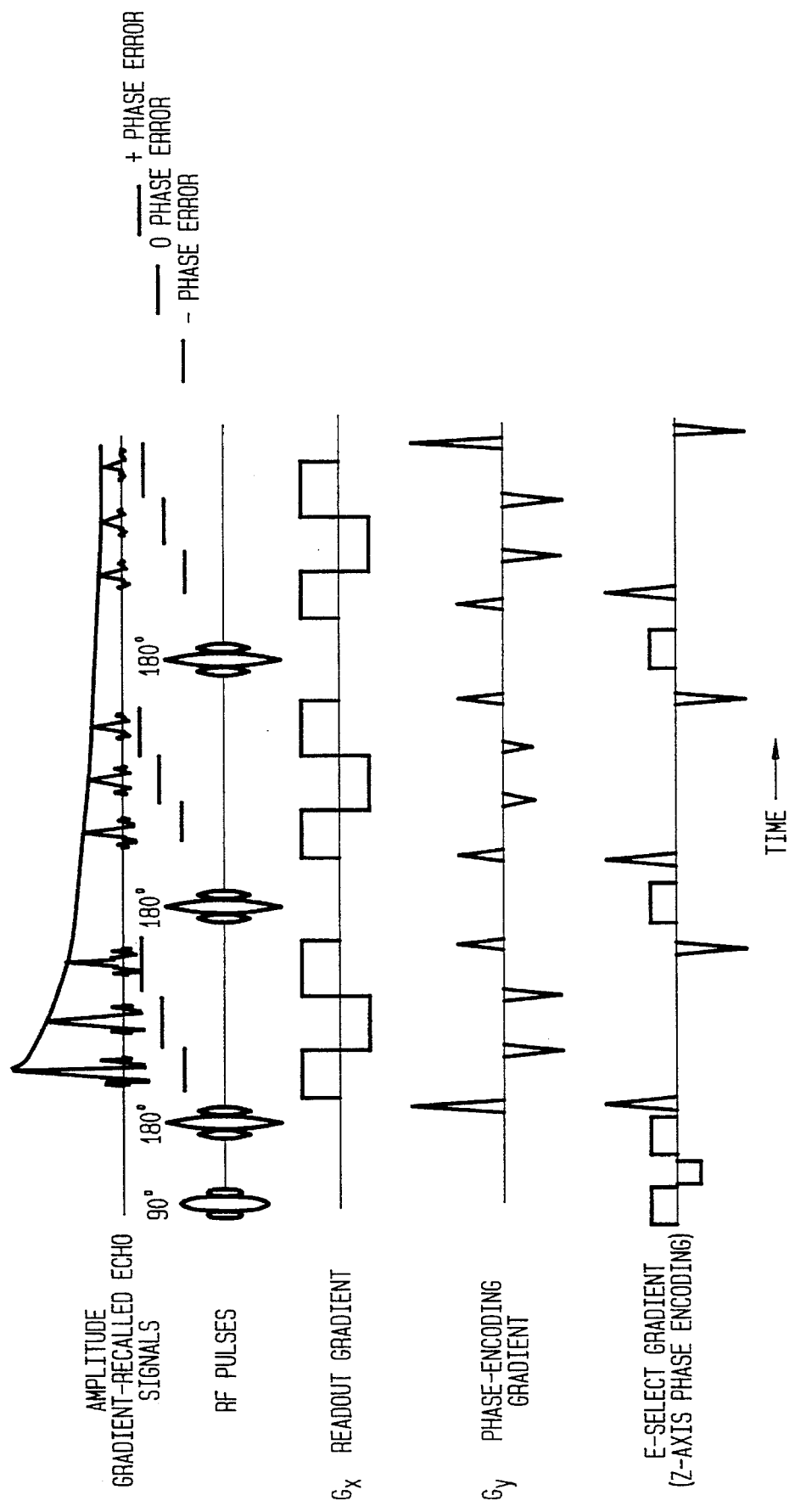
FIG. 1 shows a conventional three-dimensional GRASE-type MR pulse sequence.

The exemplary three-dimensional GRASE-type MR pulse sequence schematically illustrated in FIG. 1 is in accordance with the disclosure of U.S. Pat. No. 5,270,654. In this example, for a particular phase-encoding along the Z-axis, there are three RF refocussing pulses and the readout gradient is reversed twice after each RF refocussing pulse. Therefore, three gradient-recalled echo signals (one spin echo signal in the center, with one gradient echo signal on either side) are read out after each RF refocussing pulse. As a result, for each phase-encoding along the Z-axis, the FIG. 1 MR pulse sequence produces nine (three RF refocussing pulses, each followed by three echo signals) echo signals. As is also shown in FIG. 1, T2 decay progressively diminishes the amplitude of the induced echo signals; later-induced echo signals have amplitudes which are less than those of earlier-induced echo signals. For the purposes of the present example, let it be assumed that there are to be three phase-encodings along the Z-axis of the MR imager. Then, as is shown in FIG. 2, there will be a three-layer k-space matrix, corresponding to three in-plane images, each acquired at a different position along the Z-axis.

As described in U.S. Pat. No. 5,270,654, the echo signals are interleaved in k-space. This interleaving determines the order in which each in-plane layer of the three-dimensional k-space matrix is filled with lines of MR data. Since each in-plane layer of the three-dimensional k-space matrix contains nine lines of data that are read out at different phase-encoding gradients, and since the phase-encoding is interleaved, the first line of MR data is read out at an in-plane phase-encoding gradient of +4, the second line of MR data is read out at an in-plane phase-encoding gradient of +1, and the third line of MR data is read out at an in-plane phase-encoding gradient of −2. The fourth line of MR data is then read out at an in-plane phase-encoding gradient of +3, the fifth at an in-plane phase-encoding gradient of +0, and the sixth at an in-plane phase-encoding gradient of −3.

Figure 2:
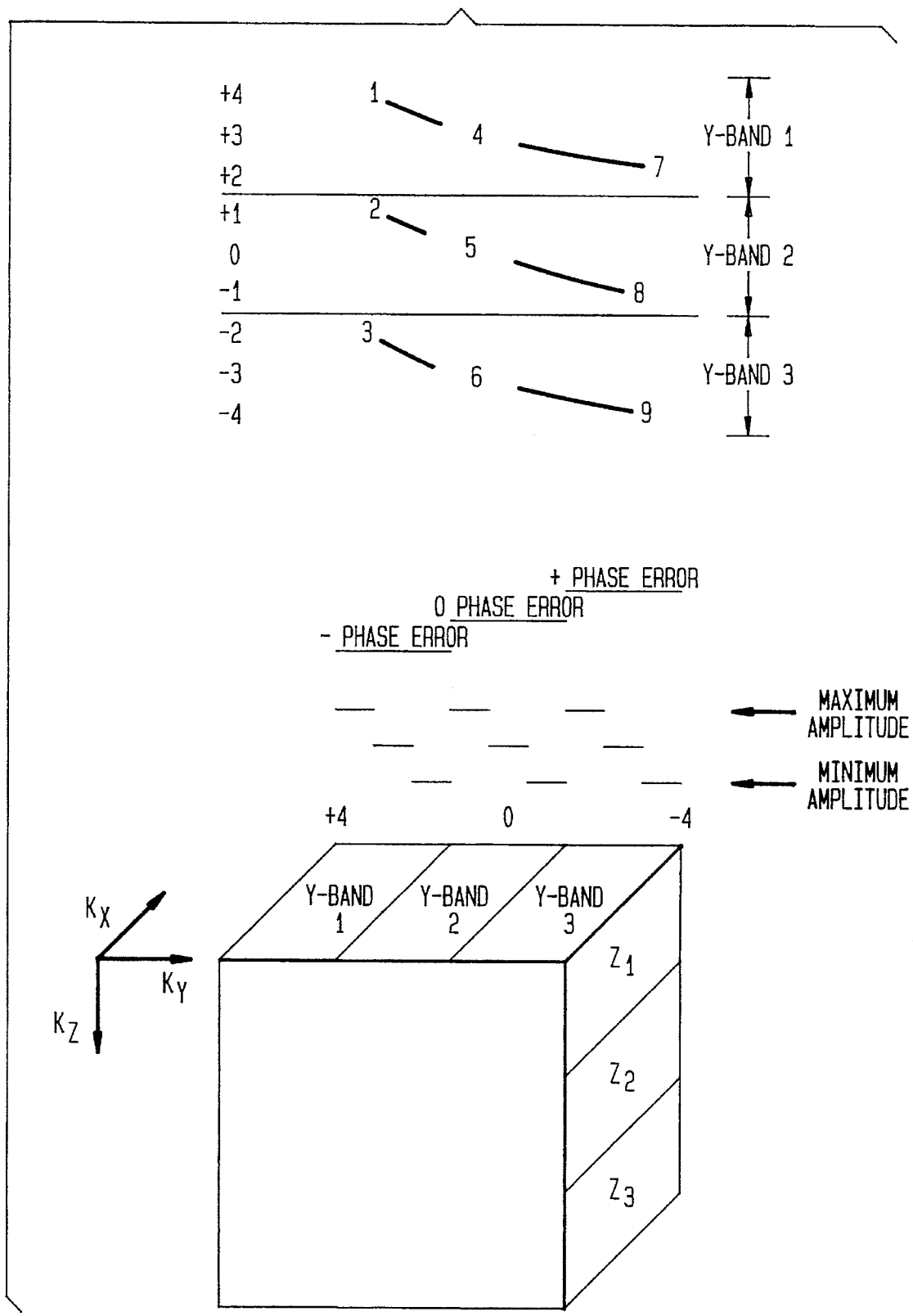
FIG. 2 shows how T2 decay causes the FIG. 1 MR pulse sequence to produce amplitude-modulated MR data in each plane of a three-dimensional k-space matrix.

In FIG. 2, each in-plane phase-encoding gradient is horizontally aligned with a number that represents the temporal position, within the MR pulse sequence, at which the corresponding line of MR data is read out. The spacing between the Y axis and the temporal position number increases with decreasing amplitude of the induced echo signal. This graphic representation illustrates that the data in each in-plane layer of the k-space matrix is periodic in its amplitude-modulation; there are three bands of lines (these three bands are indicated as Y-Band 1, Y-Band 2 and Y-Band 3 in FIG. 2) within k-space within which the amplitude of the induced echo signals varies greatly, and in the identical manner. (There are three such bands because, by assumption, the readout gradient such bands because, by assumption, the readout gradient is twice reversed after each RF refocussing pulse, causing three echo signals to be induced after each RF refocussing pulse.)

When the k-space data is subjected to Fourier transformation to produce an MR image, the periodic amplitude modulation illustrated in FIG. 2 is decoded as multiple AM ringing artifacts. These artifacts are distracting and interfere with the diagnostic quality of the final MR image.

MR data acquired in conventional three-dimensional GRASE-type MR pulse sequences is not only amplitude modulated; it is phase modulated as well. As in conventional two-dimensional MR pulse sequences of the GRASE type, phase errors change continuously with each gradient-recalled echo signal between successive RF refocussing pulses. Furthermore, all the gradient-recalled echo signals that occur first in each group of three have identical phase errors, all the gradient-recalled echo signals that occur second in each group of three have identical phase errors, and so too as to all gradient-recalled echo signals that occur third in each group of three. Still further, the Z-axis phase encoding is identical in each gradient-recalled echo signal between each adjacent pair of RF refocussing pulses. As a result, the phase errors of MR data acquired using a conventional three-dimensional GRASE-type MR pulse sequence are stepped with each Y-Band along the Y axis.

Figure 3:
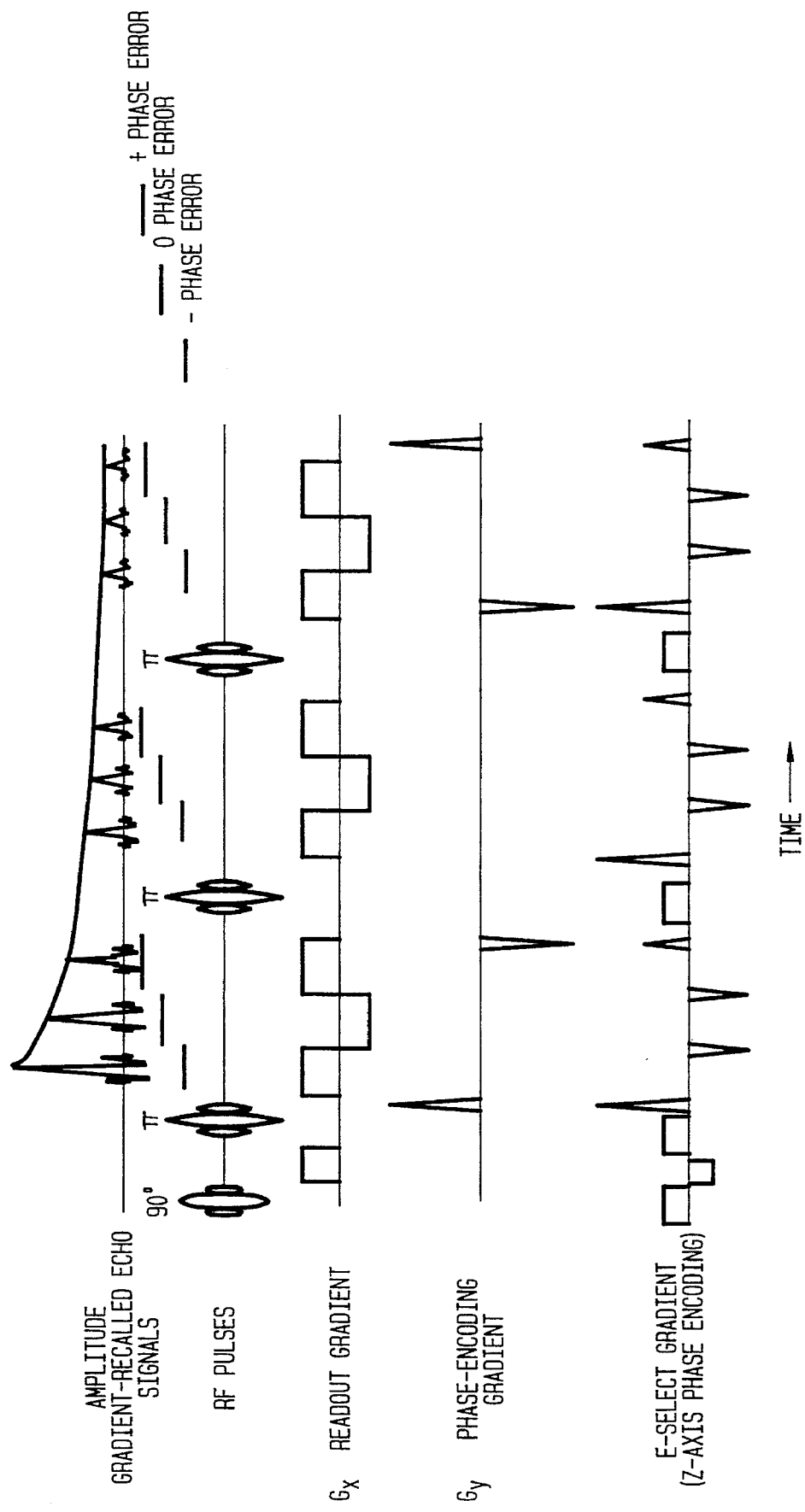
FIG. 3 shows a three-dimensional GRASE-type MR pulse sequence in accordance with a first preferred embodiment of the invention.
Figure 4:
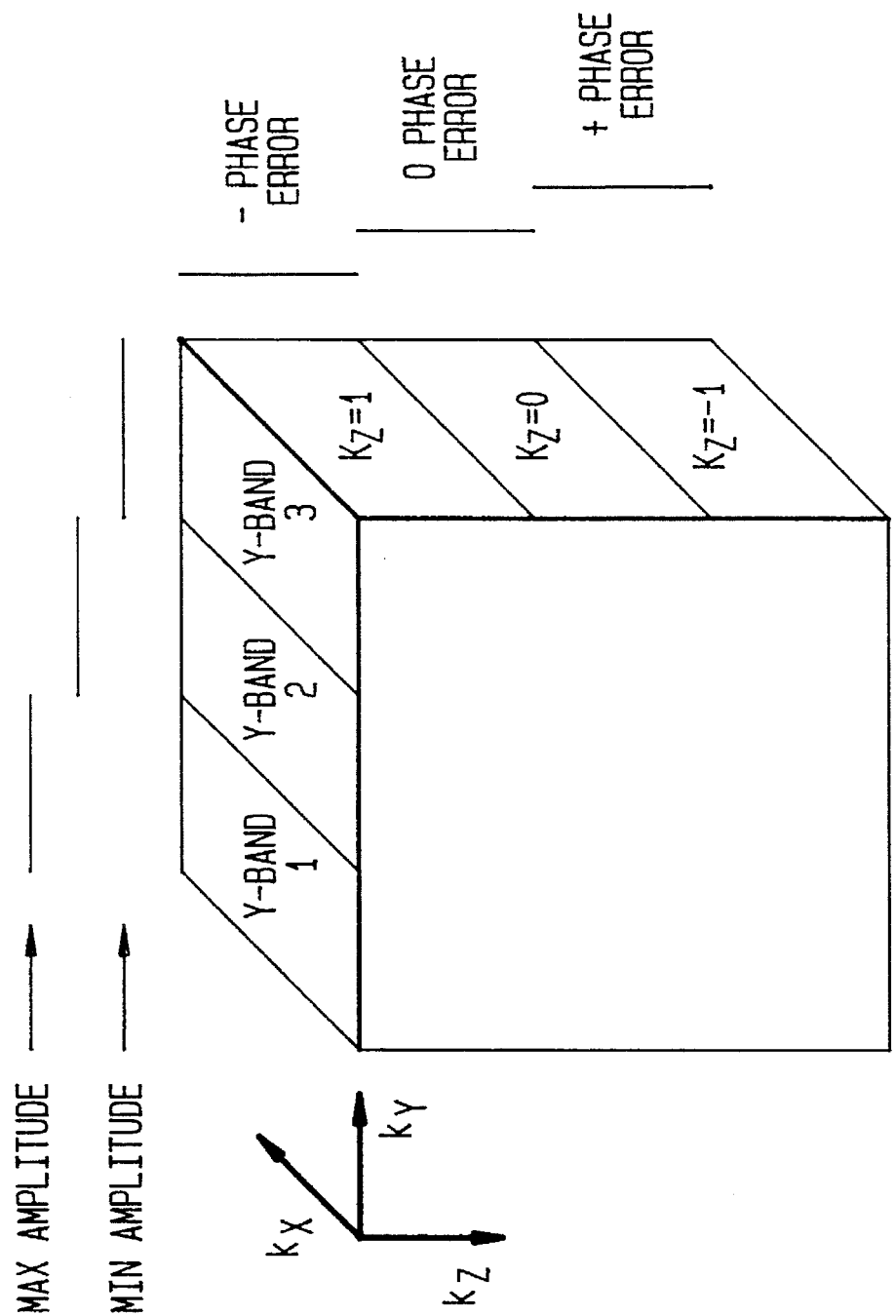
FIG. 4 shows how the first preferred embodiment of the invention causes in-plane MR data in a three-dimensional k-space matrix to be free of amplitude and phase modulation.

In accordance with the first preferred embodiment of the invention as illustrated in FIG. 3, the phase-encoding along the Z-axis is varied identically between each two adjacent RF refocussing pulses. The in-plane phase encoding is invariant between each two adjacent RF refocussing pulses and changes monotonically from the beginning of the MR sequence to the end. Therefore, the first line of MR data relates to the top in-plane layer kz=1 of the three-dimensional k-space matrix, the second line of MR data relates to the middle in-plane layer kz=0 of the three-dimensional k-space matrix, and the third line of MR data relates to the bottom in-plane layer kz=−1 of the three-dimensional k-space matrix. As a result, the progressive decrease in amplitude resulting from T2 decay does not occur in a single in-plane Y-Band of the k-space matrix and therefore the data in each in-plane layer is not amplitude-modulated. The same is true of phase modulation. This is because the phase-encoding along the Z-axis varies with position of the gradient-recalled echo signal within the three signal group that exists between each two RF refocussing pulses, i.e the Z-axis phase encoding varies in step with the phase error of the gradient-recalled echo signals. This is shown in FIG. 4. Here, the phase error is stepped along the Z-axis and the amplitude changes are stepped along the Y-axis. As can be seen from FIG. 4, neither the phase errors nor the changes in amplitude are periodic, i.e. periodic amplitude modulation is removed.

While in accordance with the first preferred embodiment the in-plane phase-encoding becomes progressively more negative from the beginning of the MR pulse sequence to the end, this is only preferred. It completely eliminates the periodic amplitude changes in the three-dimensional k-space data set and eliminates associated AM image artifacts. It is alternatively possible to use other in-plane phase encoding schemes instead.

A second preferred in-plane phase encoding scheme is that shown in FIG. 5. There, the initial three gradient-recalled echo signals are acquired at a zero phase-encoding gradient (i.e. the center line of MR data in each layer of k-space is acquired first). In this manner, lines of MR data which make a maximum contribution to image contrast are acquired at the beginning of the MR pulse sequence, when signal-to-noise ratios are highest.

Additionally, while there are three gradient-recalled echo signals after each RF refocussing pulse and therefore three phase-encodings along the Z-axis, there could be more; if more readout gradient reversals are used, there could be higher odd numbers of phase-encodings along the Z-axis. So, too, additional cycles of the entire pulse sequence can be acquired, each with different lines of z-axis phase encoding and y-axis phase encoding to be combined into a larger three-dimensional data set.

Although a preferred embodiment has been described above, the scope of the invention is limited only by the following claims:

I claim:

1. A method for acquiring three-dimensional MR data, comprising the step of using a GRASE-type MR pulse sequence in which Z axis phase-encoding varies identically in all signals between each two adjacent RF refocussing pulses in the MR pulse sequence.

2. The method of claim 1, wherein in-plane phase encoding remains constant in all signals between each two adjacent RF refocussing pulses in the MR pulse sequence and varies monotonically from the beginning of the MR pulse sequence to the end of the MR pulse sequence.

3. The method of claim 1, wherein the in-plane readout gradient is reversed at least twice between each two adjacent RF refocussing pulses, whereby an odd number $N \geq 3$ gradient-recalled echo signals are produced between each two adjacent RF refocussing pulses.

4. The method of claim 1, wherein in-plane phase encoding remains constant in all signals between each two adjacent RF refocussing pulses in the MR pulse sequence and varies non-monotonically from the beginning of the MR pulse sequence to the end of the MR pulse sequence.

5. The method of claim 4, wherein in-plane phase encoding is at its smallest absolute value at the beginning of the MR pulse sequence.

\* \* \* \* \*